United States Patent
Kondo et al.

(10) Patent No.: US 9,447,305 B2
(45) Date of Patent: Sep. 20, 2016

(54) SILICONE RESIN, RESIN COMPOSITION, RESIN FILM, SEMICONDUCTOR DEVICE, AND MAKING METHOD

(71) Applicant: SHIN-ETSU CHEMICAL CO., LTD., Tokyo (JP)

(72) Inventors: Kazunori Kondo, Annaka (JP); Yoichiro Ichioka, Annaka (JP); Hideto Kato, Annaka (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 0 days.

(21) Appl. No.: 14/918,080

(22) Filed: Oct. 20, 2015

(65) Prior Publication Data

US 2016/0122586 A1  May 5, 2016

(30) Foreign Application Priority Data

Oct. 30, 2014  (JP) .................. 2014-221102

(51) Int. Cl.

| | | |
|---|---|---|
| *C09D 183/06* | (2006.01) | |
| *B29C 65/00* | (2006.01) | |
| *B32B 27/08* | (2006.01) | |
| *B32B 27/26* | (2006.01) | |
| *B32B 27/20* | (2006.01) | |
| *B32B 27/28* | (2006.01) | |
| *B32B 37/24* | (2006.01) | |
| *B32B 37/00* | (2006.01) | |
| *H01L 21/78* | (2006.01) | |
| *H01L 23/29* | (2006.01) | |
| *C08G 77/52* | (2006.01) | |
| *C08K 3/36* | (2006.01) | |
| *C09D 183/14* | (2006.01) | |
| *C08G 77/14* | (2006.01) | |
| *C08G 77/48* | (2006.01) | |
| *C08G 77/50* | (2006.01) | |
| *C08L 63/00* | (2006.01) | |
| *C08L 83/14* | (2006.01) | |
| *B29L 31/34* | (2006.01) | |
| *B29K 683/00* | (2006.01) | |

(52) U.S. Cl.
CPC ............. *C09D 183/06* (2013.01); *B29C 66/45* (2013.01); *B29C 66/71* (2013.01); *B32B 27/08* (2013.01); *B32B 27/20* (2013.01); *B32B 27/26* (2013.01); *B32B 27/283* (2013.01); *B32B 37/025* (2013.01); *B32B 37/24* (2013.01); *C08G 77/14* (2013.01); *C08G 77/48* (2013.01); *C08G 77/50* (2013.01); *C08G 77/52* (2013.01); *C08K 3/36* (2013.01); *C08L 63/00* (2013.01); *C08L 83/14* (2013.01); *C09D 183/14* (2013.01); *H01L 21/78* (2013.01); *H01L 23/296* (2013.01); *B29K 2683/00* (2013.01); *B29L 2031/34* (2013.01); *B32B 2037/243* (2013.01); *B32B 2383/00* (2013.01); *B32B 2457/14* (2013.01)

(58) Field of Classification Search
CPC .... C09J 7/00; C09J 7/0239; C09J 2201/122; C09J 2201/36; C09J 2203/326; C09J 2483/00; H01L 21/304; H01L 21/6835; H01L 2221/68327; H01L 2221/6834; H01L 2221/68; Y10T 428/2852

See application file for complete search history.

(56) References Cited

U.S. PATENT DOCUMENTS

| | | |
|---|---|---|
| 2011/0105646 A1 | 5/2011 | Kan et al. |
| 2013/0113083 A1 | 5/2013 | Kondo et al. |

FOREIGN PATENT DOCUMENTS

| | | |
|---|---|---|
| EP | 2 500 934 A2 | 9/2012 |
| EP | 2 743 316 A1 | 6/2014 |
| WO | WO 2009/142065 A1 | 11/2009 |

OTHER PUBLICATIONS

Extended European Search Report issued Feb. 12, 2016, in European Patent Application No. 15188898.9.

*Primary Examiner* — Roy Potter

(74) *Attorney, Agent, or Firm* — Birch, Stewart, Kolasch & Birch, LLP

(57) ABSTRACT

A silicone resin comprising constitutional units represented by formula (1) and having a Mw of 3,000-500,000 contains 10-50 wt % of (A-1) a first silicone resin having a silicone content of 10-40 wt % and (A-2) a second silicone resin having a silicone content of 50-80 wt %. A resin composition comprising the silicone resin can be formed in film form, and it possesses satisfactory covering or encapsulating performance to large size/thin wafers. The resin composition or resin film ensures satisfactory adhesion, low warpage, and wafer protection. The resin film is useful in wafer-level packages.

11 Claims, No Drawings

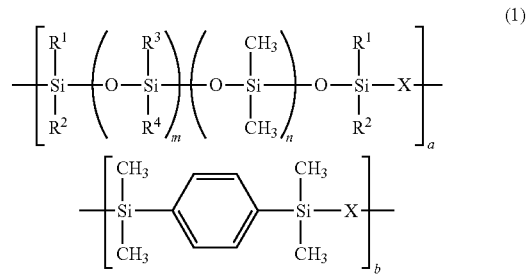

SILICONE RESIN, RESIN COMPOSITION, RESIN FILM, SEMICONDUCTOR DEVICE, AND MAKING METHOD

CROSS-REFERENCE TO RELATED APPLICATION

This non-provisional application claims priority under 35 U.S.C. §119(a) on Patent Application No. 2014-221102 filed in Japan on Oct. 30, 2014, the entire contents of which are hereby incorporated by reference.

TECHNICAL FIELD

This invention relates to a silicone resin, resin composition, and resin film as well as a semiconductor device and manufacturing method.

BACKGROUND ART

In the manufacture of microelectronic or semiconductor devices, a rapid progress is made toward wafers of larger diameter and reduced thickness. There is a need for the technique capable of encapsulating devices on the wafer level. While the technique for transfer molding solid epoxy resin compositions is conventional, a technique for compression molding liquid epoxy resin compositions are proposed in WO 2009/142065.

The transfer molding technique can cause wire deformation because the resin is flowed into narrow gaps. Short filling is more likely to occur as the encapsulation area becomes larger. The compression molding technique is difficult to precisely control the molding range at an end portion of the wafer. Also, it is not easy to optimize the flow and physical properties of the liquid encapsulating resin when it is fed into the molding machine. With the recent transition of wafers toward larger diameter and reduced thickness, the warpage of the wafer after molding, which is not noticeable in the prior art, becomes a problem. Also better wafer protection is required. It would be desirable to have a wafer molding material which can encapsulate an overall wafer at a time without raising problems including short filling at the wafer surface, and which exhibits minimal warpage and satisfactory wafer protection after molding.

CITATION LIST

Patent Document 1: WO 2009/142065

DISCLOSURE OF INVENTION

An object of the invention is to provide a resin composition and resin film which can encapsulate an overall wafer at a time (i.e., wafer molding), is effectively moldable over a large-diameter/thin wafer, offers minimal warpage and satisfactory wafer protection after molding, ensures efficient molding process, and is thus suited for wafer-level packages. Another object is to provide a silicone resin for use in the resin composition and resin film; a semiconductor device covered with the resin film; and a method for manufacturing the semiconductor device.

In one aspect, the invention provides a silicone resin comprising constitutional units represented by the compositional formula (1) and having a weight average molecular weight of 3,000 to 500,000, containing (A-1) a first silicone resin having a silicone content of 10 to 40% by weight of the first silicone resin, and (A-2) a second silicone resin having a silicone content of 50 to 80% by weight of the second silicone resin, the weight content of first silicone resin (A-1) being 10 to 50% by weight of the total weight of the silicone resin,

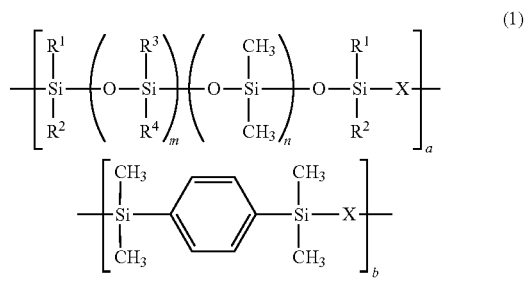

wherein $R^1$ to $R^4$ are each independently a monovalent $C_1$-$C_8$ hydrocarbon group, excluding that $R^3$ and $R^4$ are methyl at the same time, m and n each are an integer of 0 to 300, a and b are positive numbers, a+b=1, X is a divalent linking group having the general formula (2) or (3), c indicative of moles of the group of formula (2) and d indicative of moles of the group of formula (3) are in the range of $0/1 \leq d/c \leq 1/1$.

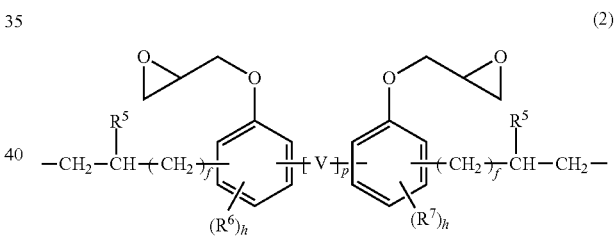

Herein V is a divalent organic group selected from the following:

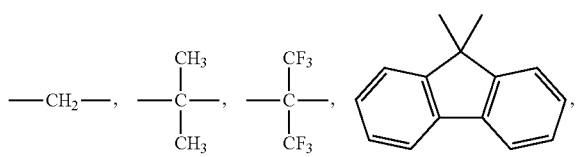

p is 0 or 1, $R^5$ is hydrogen or methyl, f is an integer of 0 to 7, $R^6$ and $R^7$ are each independently $C_1$-$C_4$ alkyl or alkoxy, and h is 0, 1 or 2.

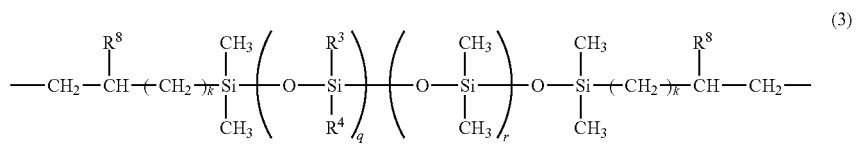

Herein $R^3$ and $R^4$ are each independently a monovalent $C_1$-$C_8$ hydrocarbon group, excluding that $R^3$ and $R^4$ are methyl at the same time, q and r each are an integer of 0 to 300, $R^8$ is hydrogen or methyl, and k is an integer of 0 to 7.

In another aspect, the invention provides a resin composition comprising (A) the silicone resin defined above, (B) an epoxy resin curing agent, and (C) a filler.

The resin composition using the silicone resin having the aforementioned characteristics can be formed into a film, with which an overall wafer can be covered (obtaining molded wafer). For large diameter/thin wafers, the resin composition ensures satisfactory molding performance, adhesion, low warpage, wafer protection, and reliability and is thus useful in wafer-level packages.

In a preferred embodiment, the amount of component (B) is 5 to 50 parts by weight per 100 parts by weight of component (A), and the weight fraction of component (C) is 30 to 90% by weight of the total weight of the composition.

This resin composition can be readily formed into a film, with which an overall wafer can be readily covered (obtaining molded wafer). For large-diameter/thin wafers, the resin composition ensures satisfactory molding performance, adhesion, low warpage, wafer protection, and reliability and is thus fully useful in wafer-level packages.

Preferably an epoxy resin cure accelerator is further added to the resin composition for improving adhesion to wafer and wafer protection. The resin composition is fully useful in wafer-level packages. Further preferably, an epoxy resin is added to the resin composition for improving adhesion and protection.

Preferably silica is used as the filler. The use of silica filler is convenient because wafer protection is further improved, and better heat resistance, moisture resistance and strength are expected as well as higher reliability.

In a further aspect, the invention provides a resin film formed from the resin composition. The resin film has good molding performance for large diameter/thin wafers. When an overall wafer is encapsulated in a batch, there is no need to cast the resin, eliminating problems like short-filling on the wafer surface. The film of the resin composition becomes a wafer molding material meeting both adhesion to wafer and wafer protection.

In a yet further aspect, the invention provides a method for preparing a resin film, comprising the steps of coating the resin composition onto a release or protective film to form a precursor including a resin composition layer, optionally laying another release or protective film on the resin composition layer, providing at least two such precursors, stripping the release or protective film from each precursor to bare the resin composition layer, and joining the bare resin composition layers to each other.

In a still further aspect, the invention provides a method for manufacturing semiconductor devices, comprising the steps of attaching the resin film to a semiconductor wafer to cover the wafer with the resin film, and singulating the molded wafer into discrete devices.

The semiconductor wafer covered with the resin film (or molded wafer) experiences minimal warpage while it is fully protected. By singulating the wafer, semiconductor devices of quality are manufactured in high yields.

In a still further aspect, the invention provides a semiconductor device obtained by heat curing the resin film to form a heat cured coating, covering a semiconductor wafer with the heat cured coating, and singulating the molded semiconductor wafer into discrete devices.

The semiconductor wafer covered with the heat cured coating obtained by heat curing the resin film experiences minimal warpage while it is fully protected. By singulating the wafer, semiconductor devices of quality and without warpage are manufactured.

ADVANTAGEOUS EFFECTS OF INVENTION

Since the resin composition using the silicone resin can be formed into a film, it possesses satisfactory covering or encapsulating performance to large size/thin wafers. An overall wafer can be encapsulated with the resin film at a time while the resin film ensures satisfactory adhesion, low warpage, and wafer protection. The resin film is thus useful in wafer-level packages.

With the semiconductor device configuration and manufacturing method, semiconductor devices of quality are manufactured in high yields.

DESCRIPTION OF PREFERRED EMBODIMENTS

As discussed above, it is desired to develop a wafer molding material which can encapsulate an overall wafer in a batch without raising problems including short filling at the wafer surface, and which exhibits tight adhesion, minimal warpage and satisfactory wafer protection after molding.

The inventors have found that a resin composition having improved adhesion to wafer and minimal warpage after curing is obtainable by combining (A) a silicone resin with (B) an epoxy resin curing agent; that the resin composition is further improved in wafer protection and reliability after curing by adding (C) a filler thereto; and that a resin film formed of the resin composition is an effective wafer molding material having both adhesion to wafer and wafer protection.

Below, the silicone resin, resin composition, resin film (composite film), semiconductor device, and manufacture of semiconductor device according to the invention are described in detail.

(A) Silicone Resin

A silicone resin according to the invention serves as component (A) in the resin composition and has a film forming ability. A resin film is formed from the resin composition. When used as wafer molding material, the resin film offers adhesion to wafer, minimal warpage and good molding performance.

The silicone resin is defined as comprising constitutional units represented by the compositional formula (1) and having a weight average molecular weight of 3,000 to 500,000, containing (A-1) a first silicone resin having a silicone content of 10 to 40% by weight of the first silicone resin, and (A-2) a second silicone resin having a silicone content of 50 to 80% by weight of the second silicone resin, the weight content of first silicone resin (A-1) being 10 to 50% by weight of the total weight of the silicone resin.

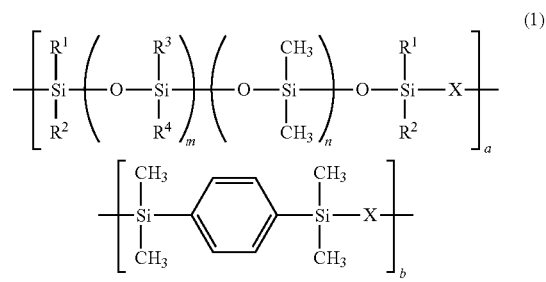

Herein $R^1$ to $R^4$ are each independently a monovalent $C_1$-$C_8$ hydrocarbon group, excluding that $R^3$ and $R^4$ are methyl at the same time, m and n each are an integer of 0 to 300, a and b are positive numbers, a+b=1. X is a divalent linking group having the general formula (2) or (3), c indicative of moles of the group of formula (2) and d indicative of moles of the group of formula (3) are in the range of 0/1 d/c 1/1.

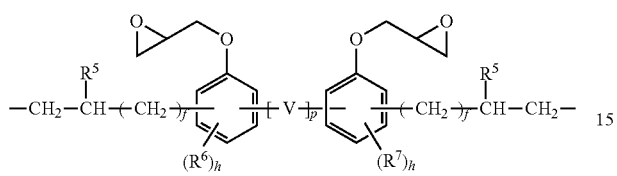
(2)

Herein V is a divalent organic group selected from the following:

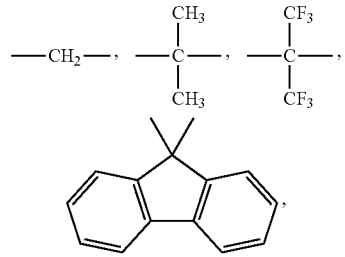

p is 0 or 1, $R^5$ is hydrogen or methyl, f is an integer of 0 to 7, $R^6$ and $R^7$ are each independently $C_1$-$C_4$ alkyl or alkoxy, and h is 0, 1 or 2.

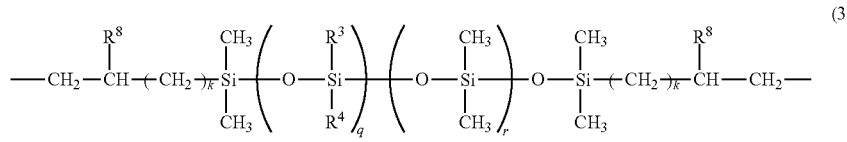
(3)

Herein $R^3$ and $R^4$ are each independently a monovalent $C_1$-$C_8$ hydrocarbon group, excluding that $R^3$ and $R^4$ are methyl at the same time, q and r each are an integer of 0 to 300, $R^8$ is hydrogen or methyl, and k is an integer of 0 to 7.

The silicone resin comprises recurring units represented by formula (1) and has a weight average molecular weight (Mw) of 3,000 to 500,000, preferably 5,000 to 200,000, as measured versus polystyrene standards by gel permeation chromatography (GPC) using tetrahydrofuran eluent. The subscripts a and b are positive numbers, a+b=1. The units may be arranged either randomly or blockwise.

In formula (1), m and n are each independently an integer of 0 to 300, preferably m is 0 to 200, more preferably 0 to 100, and n is 0 to 200, more preferably 0 to 100. X is a divalent linking group having formula (2) or (3). Assume that c is moles of the group of formula (2) and d is moles of the group of formula (3), a ratio d/c ranges from 0/1 to 1/1, preferably from more than 0/1 to 1/1, and more preferably from 0.05/1 to 0.8/1. $R^1$ to $R^4$ are each independently a monovalent hydrocarbon group of 1 to 8 carbon atoms, preferably 1 to 6 carbon atoms. Suitable hydrocarbon groups include alkyl, cycloalkyl and aryl groups, such as methyl, ethyl, propyl, hexyl, cyclohexyl and phenyl. Inter alia, methyl and phenyl are preferred because of availability of reactants. It is excluded that $R^3$ and $R^4$ are methyl at the same time.

In formula (2), $R^5$ is hydrogen or methyl, f is an integer of 0 to 7, preferably 1 to 3, $R^6$ and $R^7$ are each independently an alkyl or alkoxy group of 1 to 4 carbon atoms, preferably 1 to 2 carbon atoms, such as methyl, ethyl, propyl, tert-butyl, methoxy or ethoxy, and h is 0, 1 or 2, preferably 0.

In formula (2), V is a divalent organic group selected from the following, and p is 0 or 1.

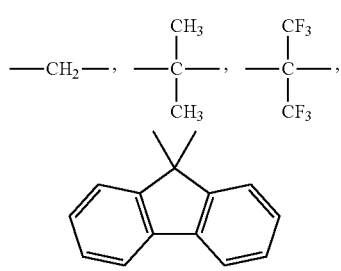

In formula (3), $R^3$ and $R^4$ are each independently a monovalent $C_1$-$C_8$ hydrocarbon group, excluding that $R^3$ and $R^4$ are methyl at the same time. The subscripts q and r each are an integer of 0 to 300, preferably q is 0 to 200, more preferably 0 to 100, and r is 0 to 200, more preferably 0 to 100. $R^8$ is hydrogen or methyl, and k is an integer of 0 to 7.

The subscripts a and b are positive numbers, a+b=1; preferably $0.05 \leq a \leq 0.8$, more preferably $0.1 \leq a \leq 0.7$, and $0.2 \leq b \leq 0.95$, more preferably $0.3 \leq b \leq 0.9$.

Preparation of Silicone Resin (A)

The silicone resin may be prepared by effecting addition polymerization of compounds having the general formulae (4) to (7) in the presence of a metal catalyst.

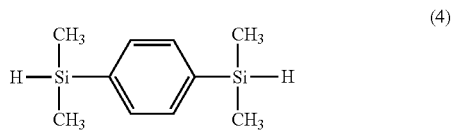
(4)

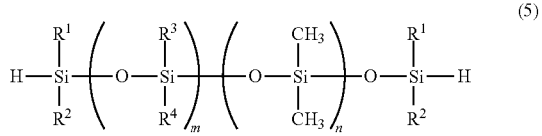
(5)

Herein $R^1$ to $R^4$ are each independently a monovalent $C_1$-$C_8$ hydrocarbon group, excluding that $R^3$ and $R^4$ are methyl at the same time, m and n each are an integer of 0 to 300.

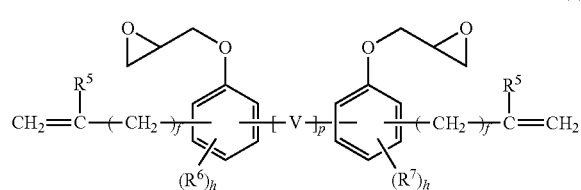

(6)

Herein V is a divalent organic group selected from the following:

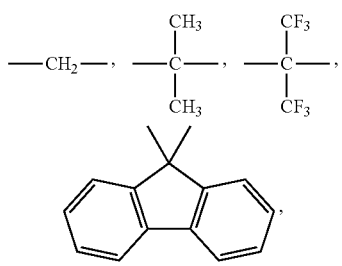

p is 0 or 1, $R^5$ is hydrogen or methyl, f is an integer of 0 to 7, $R^6$ and $R^7$ are each independently $C_1$-$C_4$ alkyl or alkoxy, and h is 0, 1 or 2.

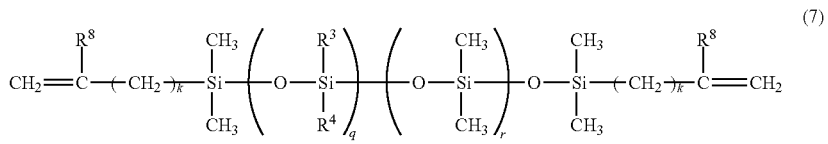

(7)

Herein $R^3$ and $R^4$ are each independently a monovalent $C_1$-$C_8$ hydrocarbon group, excluding that $R^3$ and $R^4$ are methyl at the same time, q and r each are an integer of 0 to 300, $R^8$ is hydrogen or methyl, and k is an integer of 0 to 7.

The metal catalyst used herein is typically a platinum group metal base catalyst. Exemplary catalysts are platinum, palladium and rhodium base catalysts including elemental platinum group metals such as platinum (inclusive of platinum black), rhodium and palladium; platinum chloride, chloroplatinic acid and chloroplatinic acid salts such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$ wherein x is an integer of 0 to 6, preferably 0 or 6; alcohol-modified chloroplatinic acid (see U.S. Pat. No. 3,220,972); complexes of chloroplatinic acid with olefins (see U.S. Pat. Nos. 3,159,601, 3,159,662 and 3,775,452); platinum group metals such as platinum black and palladium on carriers such as alumina, silica and carbon; rhodium-olefin complexes; chlorotris(triphenylphosphine)rhodium (known as Wilkinson catalyst); and complexes of platinum chloride, chloroplatinic acid or chloroplatinic acid salts with vinyl-containing siloxanes, especially vinyl-containing cyclic siloxanes.

The catalyst is used in a catalytic amount, typically 0.0001 to 0.1%, preferably 0.001 to 0.01% by weight based on the total weight of reactants. Although addition reaction may run even in a solventless system, a solvent may be used if desired. The solvent, if used, is preferably selected from hydrocarbon solvents such as toluene and xylene. The reaction temperature is not particularly limited as long as the catalyst is not deactivated and polymerization is complete within an acceptable time. For example, an appropriate temperature is 40 to 150° C., especially 60 to 120° C. The reaction time may be selected depending on the type and amount of reactants, and is preferably 0.5 to 100 hours, more preferably 0.5 to 30 hours. When the solvent is used, vacuum distillation is carried out at the end of reaction to distill off the solvent.

The reaction procedure is not particularly limited. When compounds of formulae (4), (5), (6), and (7) are reacted, one exemplary procedure is by premixing the compounds of formulae (6) and (7), heating the mixture, adding a metal catalyst to the mixture, and adding dropwise the compounds of formulae (4) and (5) over 0.1 to 5 hours.

Preferably the compounds of formulae (4), (5), (6), and (7) are blended such that the ratio of the total moles of hydrosilyl groups in the compounds of formulae (4) and (5) to the total moles of alkenyl groups in the compounds of formulae (6) and (7) may range from 0.67 to 1.67, more preferably from 0.83 to 1.25. The Mw of the polymer may be controlled by using a molecular weight modifier such as a monoallyl compound (e.g., o-allylphenol), monohydrosilane (e.g., triethylhydrosilane) or monohydrosiloxane.

Resin Composition

A second embodiment of the invention is a resin composition comprising (A) the silicone resin defined above, (B) an epoxy resin curing agent, and (C) a filler.

Epoxy Resin Curing Agent (B)

Component (B) is to incur crosslinking reaction with the silicone resin (A) and effective for further improving the adhesion to wafer, protection and reliability of the silicone resin. The epoxy resin curing agent may be any of curing agents commonly used for the curing of epoxy resins. In view of heat resistance, it is preferably an aromatic curing agent or alicyclic curing agent though not limited thereto. Suitable epoxy resin curing agents include amine curing agents, acid anhydride curing agents, boron trifluoride amine complex salts, and phenolic resins. Exemplary of the amine curing agents are aliphatic amines such as diethylenetriamine, triethylenetetramine, and tetraethylenepentamine, alicyclic amines such as isophorone diamine, aromatic amines such as diaminodiphenylmethane and phenylenediamine, and dicyandiamide. Exemplary of the acid anhydride curing agents are phthalic anhydride, pyromellitic anhydride, trimellitic anhydride, and hexahydrophthalic anhydride. These epoxy resin curing agents may be used alone or in admixture.

Phenolic resins are also useful epoxy resin curing agents. Suitable phenolic resins include resole type phenolic resins and/or novolak type phenolic resins, which are prepared from such reactants as phenol, bisphenol A, alkylphenols such as p-tert-butylphenol, octylphenol, and p-cumylphenol, p-phenylphenol, and cresol. These phenolic resins may be used alone or in admixture.

The amount of the epoxy resin curing agent used is preferably 5 to 50 parts, more preferably 5 to 40 parts by weight per 100 parts by weight of component (A), but not limited thereto. An amount of the curing agent within the range ensures that the resin composition is improved in adhesion and protection, and the cured resin composition is more reliable.

In addition to the epoxy resin curing agent, the resin composition may contain an epoxy resin cure accelerator. The cure accelerator is effective for adequate and uniform progress of curing reaction. The amount of the cure accelerator used is preferably 0.1 to 10 parts, more preferably 0.2 to 5 parts by weight per 100 parts by weight of component (A), but not limited thereto.

Examples of the epoxy resin cure accelerator include imidazole compounds such as 2-methylimidazole, 2-ethylimidazole, 2-ethyl-4-methylimidazole, ethylisocyanates of the foregoing, 2-phenylimidazole, 2-phenyl-4-methylimidazole, 2-phenyl-4-methyl-5-hydroxymethylimidazole, and 2-phenyl-4,5-dihydroxymethylimidazole; DBU compounds such as 1,8-diazabicyclo(5.4.0)undecane-7 (DBU), 1,5-diazabicyclo(4.3.0)nonene-5 (DBN), organic acid salts of DBU, phenolic resin salts of DBU, and tetraphenylborate salts of DBU derivatives; triorganophosphines such as triphenylphosphine, tributylphosphine, tris(p-methylphenyl)phosphine, tris(p-methoxyphenyl)phosphine, tris(p-ethoxyphenyl)phosphine, triphenylphosphine-triphenylborate, and tetraphenylphosphine-tetraphenylborate; quaternary phosphonium salts, tertiary amines such as trimethyleneammonium-triphenylborate, and tetraphenylboric acid salts thereof. The cure accelerators may be used alone or in admixture.

Filler (C)

Component (C) is a filler for imparting wafer protection to the resin composition, improving its heat resistance, moisture resistance and strength, and enhancing its reliability. Suitable fillers include silicic acid salts such as talc, calcined clay, non-calcined clay, mica and glass; oxides such as titanium oxide, alumina, fused silica (e.g., fused spherical silica and fused ground silica), and crystalline silica powder; carbonates such as calcium carbonate, magnesium carbonate and hydrotalcite; hydroxides such as aluminum hydroxide, magnesium hydroxide, and calcium hydroxide; sulfates and sulfites such as barium sulfate, calcium sulfate, calcium sulfite; boric acid salts such as zinc borate, barium metaborate, aluminum borate, calcium borate, and sodium borate; and nitrides such as aluminum nitride, boron nitride, and silicon nitride. The fillers may be used alone or in admixture. Inter alia, powdered silica such as fused silica or crystalline silica is preferred. Examples of the powdered silica include reinforcing silica such as fumed silica or precipitated silica, and crystalline silica such as quartz. These silica species are commercially available, for example, under the trade name of Aerosil R972, R974, and R976 from Nippon Aerosil Co., Ltd., SE-2050, SC-2050, SE-1050, SO-E1, SO-C1, SO-E2, SO-C2, SO-E3, SO-C3, SO-E5, and SO-05 from Admatechs, and Musil 120A and Musil 130A from Shin-Etsu Chemical Co., Ltd.

The filler preferably has an average particle size of 0.01 to 20 µm, more preferably 0.01 to 10 µm, although the particle size is not limited thereto. An inorganic filler with an average particle size beyond the lower limit is unlikely to agglomerate and effective to impart strength. An inorganic filler with an average particle size below the upper limit allows the resin to flow between chips and achieves dense filling. The average particle size is measured by a particle size distribution measuring instrument based on the laser diffraction method, as a weight average value, that is, weight basis 50% cumulative particle diameter ($D_{50}$) or median diameter.

The filler is preferably used in an amount of 30 to 90% by weight, more preferably 50 to 85% by weight based on the total weight of the resin composition. An amount of the filler below the upper limit ensures a film forming ability, smooth resin flow and dense filling. An amount of the filler above the lower limit is fully effective.

Epoxy Resin

To the resin composition, an epoxy resin may be added for the purpose of improving adhesion to wafer and protection. Like the silicone resin (A), the epoxy resin undergoes crosslinking reaction with the epoxy resin curing agent (B) for thereby improving adhesion to wafer, protection, and reliability.

Examples of the epoxy resin include bisphenol A epoxy resins, bisphenol F epoxy resins, hydrogenated products thereof, glycidyl ether based epoxy resins such as phenol novolak type epoxy resins and cresol novolak type epoxy resins, glycidyl ester based epoxy resins such as glycidyl hexahydrophthalate and dimer acid glycidyl esters, triglycidyl isocyanurate, and glycidyl amine based epoxy resins such as tetraglycidyl diaminodiphenylmethane. Inter alia, bisphenol A epoxy resins, bisphenol F epoxy resins, phenol novolak type epoxy resins, and cresol novolak type epoxy resins are preferred. These resins are commercially available, for example, under the trade name of jER 1001 and jER 517 from Mitsubishi Chemical Co., Ltd., Epiclon 830S from DIC Corp., and EOCN 103S from Nippon Kayaku Co., Ltd.

If used, the epoxy resin is preferably added in an amount of 1 to 50 parts, more preferably 2 to 30 parts by weight per 100 parts by weight of component (A).

Silane Coupling Agent

The resin composition may further comprise a silane coupling agent which is effective for improving the adhesion of the resin composition to wafer. Suitable silane coupling agents include epoxy silane coupling agents and aromatic amino silane coupling agents, which may be used alone or in admixture. If used, the silane coupling agent is preferably added in an amount of 0.01 to 5% by weight based on the total weight of the resin composition.

Another component may be added to the resin composition. For example, additives may be added for improving the compatibility between silicone resin (A) and epoxy resin curing agent (B), or enhancing the storage stability, workability and other properties of the resin composition. Suitable additives include internal parting agents such as fatty acid esters, glycerates, zinc stearate, and calcium stearate, and antioxidants such as phenol, phosphorus or sulfur-based antioxidants.

Organic Solvent

Optionally, an organic solvent may be used. Although the resin composition can be used as solventless composition, it may be dissolved or dispersed in an organic solvent to form a solution or dispersion (collectively referred to as "solution," hereinafter) prior to use. Suitable organic solvents include N,N-dimethylacetamide, methyl ethyl ketone, N,N-dimethylformamide, cyclohexanone, cyclopentanone, N-methyl-2-pyrrolidone, toluene, methanol, ethanol, isopropanol, acetone, propylene glycol monomethyl ether, and propylene glycol monomethyl ether acetate (PGMEA). Inter alia, methyl ethyl ketone, cyclopentanone, propylene glycol monomethyl ether, and PGMEA are preferred. The organic solvents may be used alone or in admixture.

Resin Film

Preferably the resin composition is preformed into a film. The resin film has good molding ability to large-diameter/thin wafers, and eliminates a need to cast the resin composition when a wafer is encapsulated in a batch. This essentially solves the outstanding problems in the prior art including wire deformation and short filling at wafer surface in the case of transfer molding, difficult control of the molding range in the case of compression molding, and fluidity and physical properties of liquid encapsulant resins.

The thickness of the resin film is preferably 50 μm to 1,000 μm, more preferably 80 μm to 700 μm, but not limited thereto. A resin film with a thickness in the range has the advantages of minimal warpage and good protection.

In this sense, the invention provide a resin film formed from the resin composition. Embodiments of the resin film include a resin film formed from the resin composition, and a protected resin film consisting of a resin film and a protective layer covering the resin film. The protective layer will be described later. It is now described how to prepare the resin film.

Preparation of Resin Film

First, a resin composition in liquid form, i.e., resin composition solution is prepared by mixing silicone resin (A), epoxy resin curing agent (B), filler (C), and optional components in an organic solvent. Using a reverse roll coater, comma coater or the like, the resin composition solution is coated onto a protective layer (protective film or release film). The protective layer coated with the resin composition solution is passed through an in-line dryer where it is dried at 80 to 160° C. for 2 to 20 minutes to remove the organic solvent. Using a roll laminator, the coated protective layer is pressure bonded to another protective layer into a laminate, that is, a film precursor including a resin film (or layer) according to the invention. The pressure bonding conditions for lamination include a temperature of 50 to 100° C., a linear pressure of 0.5 to 5 kgf/cm, and a speed of 0.1 to 5 m/min, but are not limited thereto.

In another embodiment, at least two such film precursors are furnished, the protective layer is stripped from each precursor to bare the resin composition layer, the bare resin composition layers of the film precursors are joined to each other, yielding a (composite) resin film consisting of two resin layers. In the joining step, preferably the resin layers are bonded while heating at 30 to 120° C.

Protective Layer (Protective or Release Film)

The protective layer used herein is not particularly limited as long as it can be stripped from the film precursor without adversely affecting the resin layer. The protective layer serves as a protective film or release film for wafers. Included are plastic films such as polyethylene (PE) film, polypropylene (PP) film, polymethylpentene (TPX) film, and polyester film treated with a parting agent. Typically the protective layer requires a release force of 50 to 300 mN/min and has a thickness of 25 to 100 μm, preferably 38 to 75 μm.

In the embodiment wherein more than two film precursors are furnished, after the laminate of protective layer/resin layer/protective layer is obtained as mentioned above, either one protective layer is stripped from the laminate, and the remaining resin layer/protective layer precursors are joined together, yielding a composite film consisting of two resin layers in direct bond. By repeating the stripping and joining steps as necessary, a composite film consisting of multiple resin layers, preferably 2 to 4 resin layers is obtainable. The joining conditions may be as in forming the protective film/resin layer precursor.

Wafer

The wafer to be covered with the resin film in a batch is not particularly limited, and it may be a wafer having semiconductor devices or chips mounted thereon or a semiconductor wafer having semiconductor devices built in its surface. The resin film has a good filling ability relative to the wafer surface prior to molding and offers minimal warpage and good protection after molding. The resin film is advantageously applicable to large-diameter wafers having a diameter of at least 8 inches, typically 8 inches (200 mm) or 12 inches (300 mm), and thin wafers which have been thinned to a thickness of 5 to 300 μm, although the wafer is not limited thereto.

Coverage of Wafer

The method for covering or encapsulating a wafer with the resin film of the invention is not particularly limited. For example, one of the protective layers (in the laminate of resin film sandwiched between protective layers) is stripped. Using a vacuum laminator (e.g., model TEAM-100RF by Takatori Corp.) whose vacuum chamber is set at a vacuum of 50 to 1,000 Pa, preferably 50 to 500 Pa, typically 100 Pa, and a temperature of 80 to 200° C., preferably 80 to 130° C., typically 100° C., the bare resin film on the protective layer is attached to a wafer in a batch. After restoration of atmospheric pressure, the wafer is cooled to room temperature and taken out of the laminator, and the protective layer was stripped off. Thereafter, the resin film on the wafer is heated at 120 to 220° C. for 15 to 180 minutes for curing the resin film.

Semiconductor Device

The semiconductor wafer covered with the resin film in the heat cured state is then diced (singulation) into discrete semiconductor devices. Specifically, the resin film-covered wafer (also referred to as molded wafer) is attached to a semiconductor processing protective tape (such as dicing tape), with the resin film or wafer in contact with the tape, and rested on a chuck table of a dicer, before it is diced by means of a dicing saw with a dicing blade (e.g., DFD6361 by DISCO Corp.). Although the spindle revolution and cutting speed of dicing operation may vary over a wide range, appropriate dicing conditions include a spindle revolution of 25,000 to 45,000 rpm and a cutting speed of 10 to 50 mm/sec. Discrete units are generally dimensioned from 2 mm×2 mm to 30 mm×30 mm, although the dimensions depend on a particular semiconductor package design.

Now that the wafer which is minimized in warpage and fully protected with the resin film is singulated using a dicing blade, for example, discrete semiconductor devices of quality are obtained in high yields.

Manufacture of Semiconductor Device

The process for manufacturing semiconductor devices starts with the laminate of resin film sandwiched between protective layers, and involves the steps of peeling one protective layer from the laminate to bare the resin film, attaching the bare resin film to a semiconductor wafer, and peeling the other protective layer from the resin film, for thereby covering the semiconductor wafer with the resin film, and singulating the covered semiconductor wafer into discrete pieces.

EXAMPLE

Synthesis Examples, Examples and Comparative Examples are given below by way of illustration and not by way of limitation.

In Synthesis Examples, the weight average molecular weight (Mw) of a polymer was measured by gel permeation chromatography (GPC) versus monodisperse polystyrene standards, using GPC column TSKgel Super HZM-H (Tosoh Corp.) under conditions including tetrahydrofuran eluent, flow rate 0.6 mL/min and column temperature 40° C.

The compounds used in Examples and Comparative Examples are identified below.

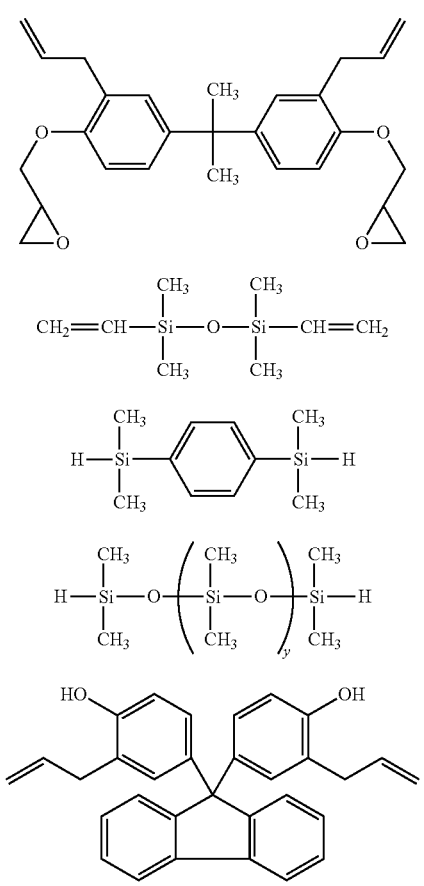

Note that Compounds S-2, S-3 and S-4 are commercially available from Shin-Etsu Chemical Co., Ltd.

Synthesis Example 1

A 3-L flask equipped with a stirrer, thermometer, nitrogen purging line and reflux condenser was charged with 210 g (0.50 mol) of Compound S-1, to which 2,000 g of toluene was added. The flask was heated at 70° C., after which 1.0 g of a toluene solution of chloroplatinic acid (Pt concentration 0.5 wt %) was admitted, and 82.8 g (0.425 mol) of Compound S-3 and 53.0 g (0.075 mol) of Compound S-4 wherein y=10 were added dropwise over 1 hour. This resulted in a ratio of (total moles of hydrosilyl groups)/(total moles of alkenyl groups)=1/1, and a silicone content of 15.3 wt %. At the end of dropwise addition, the reaction solution was heated at 100° C. and ripened for 6 hours. Toluene was distilled off in vacuum from the reaction solution, yielding a product having a Mw of 41,000. The product is designated Resin #1.

Synthesis Example 2

A 3-L flask equipped with a stirrer, thermometer, nitrogen purging line and reflux condenser was charged with 147 g (0.35 mol) of Compound S-1 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %) was admitted, and 82.8 g (0.425 mol) of Compound S-3 and 118.8 g (0.075 mol) of Compound S-4 wherein y=20 were added dropwise over 2 hours. This resulted in a ratio of (total moles of hydrosilyl groups)/(total moles of alkenyl groups)=1/1, and a silicone content of 39.0 wt %. At the end of dropwise addition, the reaction solution was heated at 100° C. and ripened for 6 hours. Toluene was distilled off in vacuum from the reaction solution, yielding a product having a Mw of 45,000. The product is designated Resin #2.

Synthesis Example 3

A 5-L flask equipped with a stirrer, thermometer, nitrogen purging line and reflux condenser was charged with 210 g (0.50 mol) of Compound S-1, to which 2,000 g of toluene was added. The flask was heated at 70° C., after which 0.5 g of a toluene solution of chloroplatinic acid (Pt concentration 0.5 wt %) was admitted, and 72.9 g (0.375 mol) of Compound S-3 and 345.9 g (0.125 mol) of Compound S-4 wherein y=40 were added dropwise over 1 hour. This resulted in a ratio of (total moles of hydrosilyl groups)/(total moles of alkenyl groups)=1/1, and a silicone content of 55.0 wt %. At the end of dropwise addition, the reaction solution was heated at 100° C. and ripened for 6 hours. Toluene was distilled off in vacuum from the reaction solution, yielding a product having a Mw of 42,000. The product is designated Resin #3.

Synthesis Example 4

A 5-L flask equipped with a stirrer, thermometer, nitrogen purging line and reflux condenser was charged with 147 g (0.35 mol) of Compound S-1 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %) was admitted, and 72.9 g (0.375 mol) of Compound S-3 and 789.9 g (0.125 mol) of Compound S-4 wherein y=40 were added dropwise over 1 hour. This resulted in a ratio of (total moles of hydrosilyl groups)/(total moles of alkenyl groups)=1/1, and a silicone content of 78.8 wt %. At the end of dropwise addition, the reaction solution was heated at 100° C. and ripened for 6 hours. Toluene was distilled off in vacuum from the reaction solution, yielding a product having a Mw of 45,000. The product is designated Resin #4.

Comparative Synthesis Example 1

A 5-L flask equipped with a stirrer, thermometer, nitrogen purging line and reflux condenser was charged with 151 g (0.35 mol) of Compound S-5 and 27.9 g (0.15 mol) of Compound S-2, to which 2,000 g of toluene was added. The flask was heated at 70° C., after which 1.0 g of a toluene solution of chloroplatinic acid (Pt concentration 0.5 wt %) was admitted, and 77.8 g (0.4 mol) of Compound S-3 and 309.4 g (0.1 mol) of Compound S-4 wherein y=40 were added dropwise over 1 hour. This resulted in a ratio of (total moles of hydrosilyl groups)/(total moles of alkenyl groups)=1/1, and a silicone content of 57.1 wt %. At the end of dropwise addition, the reaction solution was heated at 100° C. and ripened for 6 hours. Toluene was distilled off in vacuum from the reaction solution, yielding a product having a Mw of 38,000. The product is designated Resin #5, which was used in Comparative Example 3.

Examples 1 to 6 & Comparative Examples 1 to 3

Preparation of Resin Composition

A resin composition in liquid dispersion form was prepared by mixing silicone resin (A) (Resin #1, #2, #3 or #4), epoxy resin curing agent (B), epoxy resin cure accelerator, Epoxy Resin Curing Agent (B)

Rikacid HH: (hexahydrophthalic anhydride, molecular weight 154, New Japan Chemical Co., Ltd.)

Phenolite TD-2093: (phenol novolak resin, OH equivalent 98-102, DIC Corp.)

Epoxy Resin Cure Accelerator

Curesol 2P4MHZ: (2-phenyl-4-methyl-5-hydroxymethyl-imidazole, Shikoku Chemicals Corp.)

Filler (C)

Silica with average particle size 5.0 μm (Admatechs)

Other Components

EOCN-103S: (epoxy resin, epoxy equivalent 209-219, Nippon Kayaku Co., Ltd.)

Notably, the epoxy equivalent refers to the equivalent amount of epoxy groups per molecule.

Release film #1: E7304 (polyester, thickness 75 μm, release force 200 mN/50 mm, Toyobo Co., Ltd.)

Release film #2: E7302 (polyester, thickness 75 μm, release force 90 mN/50 mm, Toyobo Co., Ltd.)

Protective film: polyethylene film of 100 μm thick

TABLE 1

| | | | Example | | | | | | Comparative Example | | |
|---|---|---|---|---|---|---|---|---|---|---|---|
| | Component (pbw) | | 1 | 2 | 3 | 4 | 5 | 6 | 1 | 2 | 3 |
| (A) | Silicone resin (A-1) | Resin #1 | 45 | | 15 | 45 | 45 | | 100 | | |
| | | Resin #2 | | 30 | | | | 30 | | | |
| | Silicone resin (A-2) | Resin #3 | 55 | | | 55 | 55 | | | 100 | |
| | | Resin #4 | | 70 | 85 | | | 70 | | | |
| Silicone resin outside the invention | | Resin #5 | | | | | | | | | 100 |
| (B) | Curing agent | Rikacid HH | 10 | 10 | 10 | | | | 10 | 10 | 10 |
| | | Phenolite TD-2093 | | | | 11 | 30 | | | | |
| | Cure accelerator | Curesol 2P4MHZ | 1 | 1 | 1 | 1 | 1 | 1 | 1 | 1 | 1 |
| (C) | Filler | silica | 125 | 500 | 400 | 500 | 400 | 500 | 500 | 500 | 125 |
| Other component | | EOCN-103S | | | | | 35 | | | | 6 |
| Resin film thickness (μm) | | | 200 | 200 | 200 | 200 | 200 | 500 | 200 | 200 | 200 | filler (C), and optional components in accordance with the formulation shown in Table 1, adding cyclopentanone to the mixture so as to give a solids concentration of 65 wt %, agitating and milling the mixture in a ball mill for dissolution and dispersion. Notably, the amount of components in Table 1 is expressed in parts by weight.

Comparative Example 1 is a composition containing silicone resin, specifically containing silicone resin (A-1), but not silicone resin (A-2), that is, outside the scope of the invention. Comparative Example 2 is a composition containing silicone resin, specifically containing silicone resin (A-2), but not silicone resin (A-1), that is, outside the scope of the invention. Comparative Example 3 is a composition containing a silicone resin different from silicone resin (A) according to the invention, specifically Resin #5.

The components used in the preparation of resin compositions are identified below.

Example 7

Formation of Resin Film

Using a die coater, the resin composition of Example 1 in Table 1 was coated onto a release film which was Release film #1 of E7304. This was passed through a hot-air circulating oven of 4 m long set at 100° C. over 5 minutes, forming a resin layer of 100 μm thick on Release film #1. Using a roll laminator, a protective film which was a polyethylene film of 100 μm thick was joined and bonded to the resin layer under a linear pressure of 10 N/cm, yielding a first laminate of Release film #1/resin layer/protective film.

The above procedure was repeated aside from using Release film #2 of E7302 instead of Release film #1. There was obtained a second laminate of Release film #2/resin layer/protective film.

Next, the protective films (PE films) were stripped from the first and second laminates. The laminates with their bare resin layers mated together were passed through a hot roll laminator at 60° C. to form an integral laminate consisting of Release film #1/resin film/Release film #2 wherein the resin film (consisting of two resin layers) had a thickness of 200 μm.

Examples 8 to 12 & Comparative Examples 4 to 6

The procedure of Example 7 was repeated using the resin compositions in Table 1. There were obtained integral laminates each consisting of Release film #1/resin film/Release film #2 wherein the resin film had a thickness of 200 μm. It is noted that Example 12 used the same resin composition as Example 8 and formed a resin film having a thickness of 500 μm.

Coverage of Wafer with Resin Film

There were furnished silicon wafers having a diameter of 12 inches (300 mm) and a thickness of 100 μm. Release film #2 was stripped from each of the integral laminates of Examples 7 to 12 and Comparative Examples 4 to 6. Using a vacuum laminator model TEAM-300M (Takatori Corp.) whose vacuum chamber was set at a vacuum of 250 Pa, the bare resin film was attached to the silicon wafer in a batch at a temperature of 110° C. After restoration of atmospheric pressure, the silicon wafer was cooled to 25° C. and taken out of the laminator. Release film #1 was stripped off.

heated at 180° C. for 2 hours to cure the resin film. In this way, five test samples were prepared for each Example and subjected to the following bond strength test.

A bond tester (Dage series 4000-PXY by Dage) was used. In an attempt to peel the semiconductor chip (2 mm×2 mm) from the base substrate (15 mm×15 mm), a resisting force was measured and reported as the adhesion or bond strength of the resin film. The test conditions included a speed of 200 μm/sec and a height of 50 μm. The results are shown in Table 2. The value in Table 2 is an average of measurements of five test samples, and a higher value indicates a higher bond strength of the resin film (i.e., bonding sheet).

Test 4: Reliability

By operating an automatic dicing saw with a dicing blade (DAD685 by DISCO Corp.) at a spindle revolution of 40,000 rpm and a cutting speed of 20 mm/sec, the wafer covered with the cured resin film was diced into square pieces (test samples) of 10 mm×10 mm. Ten test samples (for each Example) were subjected to a thermal cycling test of repeating 1,000 cycles of holding at −25° C. for 10 minutes and holding at 125° C. for 10 minutes. After the thermal cycling test, it was inspected whether or not the resin film peeled from the wafer. The judgment is good when peel is observed in none of the samples, and poor when peel is observed in one or more samples. The results are shown in Table 2.

TABLE 2

| Test item | Example | | | | | | Comparative Example | | |
| --- | --- | --- | --- | --- | --- | --- | --- | --- | --- |
|  | 7 | 8 | 9 | 10 | 11 | 12 | 4 | 5 | 6 |
| Wafer warpage (mm) | <1 | <1 | <1 | <1 | <1 | <1 | 24 | 8 | 25 |
| Wafer supportability | good | good | good | good | good | good | good | good | good |
| Adhesion (MPa) | 27.8 | 29.9 | 30.1 | 28.4 | 29.4 | 29.9 | 28.0 | 27.5 | 25.8 |
| Reliability | good | good | good | good | good | good | poor | good | poor |

There was left the resin film-covered wafer, which was heated in an inert oven at 180° C. for 2 hours for curing the resin.

Test 1: Wafer Warpage

The wafer covered with the cured resin film was measured for warpage by a laser instrument FLX-3300-T (Toho Technology Co., Ltd.). The results are shown in Table 2. For those samples whose warpage was too large to measure by the instrument, warpage was measured by a ruler (JIS Grade 1).

Test 2: Wafer Supportability

While the resin film-covered wafer was supported at an edge, the wafer was measured for deflection. Wafer supportability is rated good when the deflection is within 20 mm and poor when the deflection exceeds 20 mm. The results are shown in Table 2.

Test 3: Adhesion

Using a vacuum laminator model TEAM-100 (Takatori Corp.) whose vacuum chamber was set at a vacuum of 100 Pa and a temperature of 100° C., a resin film of 25 μm thick was attached and bonded to a semiconductor wafer having a diameter of 6 inches and a thickness of 625 μm (Shin-Etsu Chemical Co., Ltd.). Using an automatic dicing saw with a dicing blade (DAD685 by DISCO Corp.), the wafer was diced into square pieces of 2 mm×2 mm. There was separately furnished a silicon wafer (base substrate) of 15 mm×15 mm. A square chip of 2 mm×2 mm with its resin film faced down was placed on the silicon wafer and bonded thereto at 150° C. under a load of 50 mN. The assembly was It is evident from the test data that the resin films of the resin compositions of Examples offer reduced wafer warpage, good wafer supportability, adhesion and reliability as compared from Comparative Examples.

The resin composition of the invention is formed into a film, with which a wafer can be covered or encapsulated in a batch. The resin film of the resin composition has satisfactory molding or covering performance to large-diameter/thin wafers. The resin film has the advantages of minimal warpage, wafer protection, adhesion and reliability.

Although a particular embodiment of the invention has been described in detail for purposes of illustration, various modifications and enhancements may be made without departing from the spirit and scope of the invention. Accordingly, the invention is not to be limited except as by the appended claims.

Japanese Patent Application No. 2014-221102 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A silicone resin comprising constitutional units represented by the compositional formula (1) and having a weight average molecular weight of 3,000 to 500,000, containing (A-1) a first silicone resin having a silicone content of 10 to 40% by weight of the first silicone resin, and (A-2) a second silicone resin having a silicone content of 50 to 80% by weight of the second silicone resin, the weight content of first silicone resin (A-1) being 10 to 50% by weight of the total weight of the silicone resin,

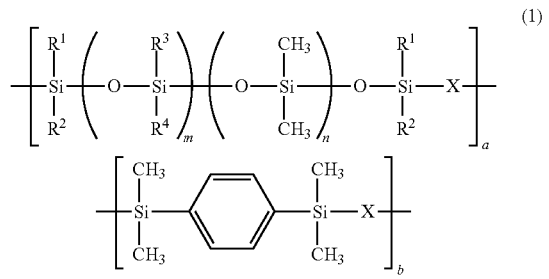

wherein $R^1$ to $R^4$ are each independently a monovalent $C_1$-$C_8$ hydrocarbon group, excluding that $R^3$ and $R^4$ are methyl at the same time, m and n each are an integer of 0 to 300, a and b are positive numbers, a+b=1, X is a divalent linking group having the general formula (2) or (3), c indicative of moles of the group of formula (2) and d indicative of moles of the group of formula (3) are in the range of $0/1 \le d/c \le 1/1$,

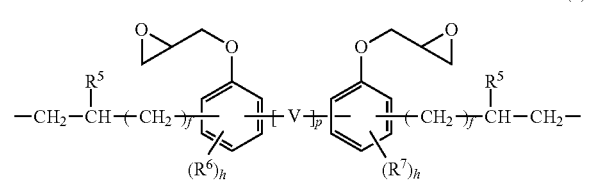

wherein V is a divalent organic group selected from the following:

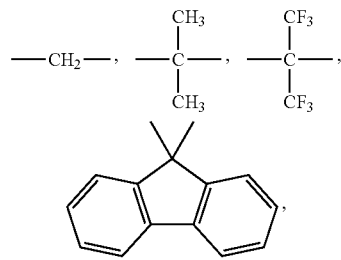

p is 0 or 1, $R^5$ is hydrogen or methyl, f is an integer of 0 to 7, $R^6$ and $R^7$ are each independently $C_1$-$C_4$ alkyl or alkoxy, h is 0, 1 or 2,

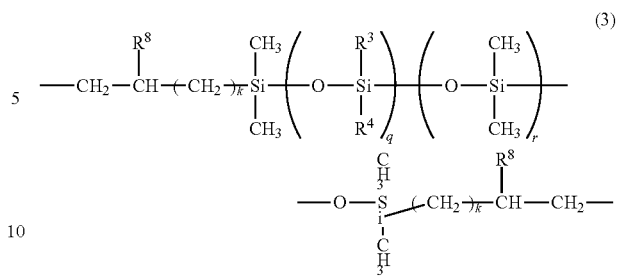

wherein $R^3$ and $R^4$ are each independently a monovalent $C_1$-$C_8$ hydrocarbon group, excluding that $R^3$ and $R^4$ are methyl at the same time, q and r each are an integer of 0 to 300, $R^8$ is hydrogen or methyl, and k is an integer of 0 to 7.

2. A resin composition comprising
(A) the silicone resin of claim 1,
(B) an epoxy resin curing agent, and
(C) a filler.

3. The resin composition of claim 2 wherein component (B) is an amine, phenol or acid anhydride based curing agent.

4. The resin composition of claim 2 wherein 5 to 50 parts by weight of component (B) is present per 100 parts by weight of component (A), and component (C) is present in a weight fraction of 30 to 90% by weight of the total weight of the composition.

5. The resin composition of claim 2, further comprising an epoxy resin cure accelerator.

6. The resin composition of claim 2, further comprising an epoxy resin.

7. The resin composition of claim 2 wherein component (C) is silica.

8. A resin film comprising the resin composition of claim 2.

9. A method for preparing a resin film, comprising the steps of:
coating the resin composition of claim 2 onto a release or protective film to form a precursor including a resin layer,
optionally applying another release or protective film to the resin layer,
providing at least two such precursors,
stripping the release or protective film from each precursor to bare the resin layer, and
joining the bare resin layers to each other.

10. A method for manufacturing semiconductor devices, comprising the steps of:
attaching the resin film of claim 8 to a semiconductor wafer to cover the wafer with the resin film, and
singulating the covered wafer into discrete devices.

11. A semiconductor device obtained from singulation of a semiconductor wafer which is covered with a film which is prepared by heat curing the resin film of claim 8.

* * * * *